(12) United States Patent
Degen et al.

(10) Patent No.: US 10,291,216 B2
(45) Date of Patent: May 14, 2019

(54) CONTROL CIRCUIT FOR A POWER SUPPLY

(71) Applicant: NXP B.V., Eindhoven (NL)

(72) Inventors: Peter Theodorus Johannes Degen, Nijmegen (NL); Wilhelmus Hinderikus Maria Langeslag, Wijchen (NL)

(73) Assignee: NXP B.V., Eindhoven (NL)

( * ) Notice: Subject to any disclaimer, the term of this patent is extended or adjusted under 35 U.S.C. 154(b) by 522 days.

(21) Appl. No.: 14/136,270

(22) Filed: Dec. 20, 2013

(65) Prior Publication Data

US 2014/0184145 A1 Jul. 3, 2014

(30) Foreign Application Priority Data

Dec. 31, 2012 (EP) ..................................... 12199842

(51) Int. Cl.
*H02M 1/00* (2006.01)
*H02M 1/12* (2006.01)
(Continued)

(52) U.S. Cl.
CPC ............ *H03K 5/14* (2013.01); *H02M 1/4208* (2013.01); *H02M 1/126* (2013.01);
(Continued)

(58) Field of Classification Search
CPC ........ H02J 7/345; H02J 7/0008; H02J 7/0026; H02K 17/08; G01R 19/16542;
(Continued)

(56) References Cited

U.S. PATENT DOCUMENTS

2001/0026147 A1* 10/2001 Nakashimo ........... H02J 7/0031
320/134
2009/0080625 A1* 3/2009 Ogawa .................... H04M 1/82
379/90.01
(Continued)

FOREIGN PATENT DOCUMENTS

WO 2012/062367 A1 5/2012

OTHER PUBLICATIONS

Moon, D. et al., "A new control method using JFET for an off-line flyback converter with low stand-by power consumption", IEEE 8th Intl. Conf. on Power Electronics and ECCE Asia (ICPE & ECCE), pp. 480-486 (2011).
(Continued)

*Primary Examiner* — Drew A Dunn
*Assistant Examiner* — Harry O'Neill-Becerril (57) ABSTRACT

The invention relates to a control circuit (250) for a power supply unit (200) that has an input (207, 209) for receiving a mains supply (208), the control circuit (250) configured to: sample the input (207, 209) in order to obtain a first sample value; sample the input (207, 209) in order to obtain a second sample value subsequent to obtaining the first sample value; compare the first and second sample values to provide an outcome; set a delay interval in accordance with the outcome of the comparison of the first and second sample values; and sample the input (207, 209) in order to obtain a third sample value after the delay interval has elapsed.

17 Claims, 8 Drawing Sheets

(51) Int. Cl.
    *H02M 1/32*    (2007.01)
    *H02M 1/42*    (2007.01)
    *H03K 5/14*    (2014.01)

(52) U.S. Cl.
    CPC ............... *H02M 2001/0012* (2013.01); *H02M 2001/0048* (2013.01); *H02M 2001/322* (2013.01); *Y02B 70/126* (2013.01); *Y02B 70/1491* (2013.01); *Y02P 80/112* (2015.11)

(58) Field of Classification Search
    CPC . G01R 31/36; Y10S 128/903; Y10S 977/904; H03K 5/14
    USPC .................................................. 320/166, 107
    See application file for complete search history.

(56) References Cited

U.S. PATENT DOCUMENTS

| | | |
|---|---|---|
| 2009/0174386 A1 | 7/2009 | Popescu et al. |
| 2010/0123447 A1 | 5/2010 | Vecera et al. |
| 2010/0280053 A1 | 11/2010 | Schoffter et al. |
| 2010/0309694 A1 | 12/2010 | Huang et al. |
| 2011/0025278 A1 | 2/2011 | Balakrishnan et al. |
| 2011/0031939 A1* | 2/2011 | Funaba ................ B60K 6/445 320/166 |
| 2011/0176341 A1 | 7/2011 | Huang |
| 2012/0075759 A1* | 3/2012 | Eaves ..................... H02H 3/40 361/86 |
| 2012/0105016 A1 | 5/2012 | Moon et al. |
| 2012/0133409 A1* | 5/2012 | Hsieh .................. H03H 11/265 327/290 |
| 2013/0027999 A1* | 1/2013 | Ptacek ................. H02M 1/126 363/126 |
| 2013/0188405 A1* | 7/2013 | Jin ....................... H02M 7/217 363/49 |

OTHER PUBLICATIONS

Extended European Search Report for EP Patent Appln. No. 12199842.1 (dated Jun. 3, 2013).

* cited by examiner

| input | Output (S1, S0) |
|---|---|
| Vin< 85V | 00 |
| 85V<Vin<160V | 01 |
| Not used | 10 |
| 160<Vin | 11 |

CONTROL CIRCUIT FOR A POWER SUPPLY

CROSS-REFERENCE TO RELATED APPLICATIONS

This application claims the priority under 35 U.S.C. § 119 of European patent application no. 12199842.1, filed on Dec. 31, 2012, the contents of which are incorporated by reference herein.

The disclosure relates to control circuits. Specifically, although not exclusively, the disclosure relates to control circuits for switched mode power supplies.

In order to suppress electromagnetic interference, in most cases an input filter is required on the mains input of apparatus like switched mode power supplies (SMPS) In addition to an inductance, EMI filters typically include one or more capacitors connected between the mains input terminals. These capacitors are known as X capacitors. EMI filters typically also include one or more capacitances connected between one of the mains terminals and a protective earth. This type of capacitor is known as a Y capacitor. Typically, the protective earth takes the form of a secondary ground, to which the Y capacitors are connected, whereas the bridge rectifier is grounded to a separate primary ground. The primary and secondary grounds have mains separation, but may typically be connected by one or more additional Y capacitors.

It is desirable, and in some regulatory regimes it is mandatory, that the voltage between the mains terminals of an apparatus is reduced to a safe value within a certain time period after the apparatus is disconnected from the mains. Otherwise, there remains a risk of electrical shock to the user, by inadvertently contacting the terminals of the plug.

According to a first aspect of the invention there is provided a control circuit for a power supply unit that has an input for receiving a mains supply, the control circuit configured to:
sample the input in order to obtain a first sample value;
sample the input in order to obtain a second sample value subsequent to obtaining the first sample value;
compare the first and second sample values to provide an outcome;
set a delay interval in accordance with the outcome of the comparison of the first and second sample values; and
sample the input in order to obtain a third sample value after the delay interval has elapsed.

The control circuit can reduce the power consumption of the power supply unit by setting an appropriate delay interval that is to be applied before sampling again. In this way, the number of samples taken over a fixed period of time can be reduced, which reduces the total power consumed by taking samples of the input for that fixed period of time. This is because unnecessary sampling of the mains power supply can be avoided or reduced.

The sampled values may be digitized sample values. The control circuit may be configured to digitize the sample values to provide digitized sample values. The comparison may be a comparison of digitized sample values.

The control circuit may be further configured to:
set the delay interval as a first delay interval if the outcome of the comparison is indicative of the second sample value being smaller than or equal to the first sample value;
set the delay interval as a second delay interval if the outcome of the is comparison is indicative of the second sample value being larger than the first sample value.

The second delay interval may be longer than the first delay interval.

The second delay interval may have a duration of more than 10, 32, 64 milliseconds or 0.5 seconds, or may be greater than or equal to a duration of a quarter or a half of an AC waveform of the mains supply. The second delay interval may also depend on another setting or mode of operation of the power supply unit.

The power supply unit may further comprise a drainage switch configured to selectively connect the input to ground in accordance with a control signal; and
wherein the control circuit is further configured to, if the outcome of the comparison is indicative of the second sample value being smaller than or equal to the first sample value, then:
determine how many consecutive sample values are smaller than or equal to an immediately preceding sample value; and
increment a count of how many consecutive sample values are smaller than or equal to an immediately preceding sample value; and
if the count is greater than a threshold, then set the control signal for closing the drainage switch;
if the count is not greater than a threshold, then set the control signal for opening the drainage switch.

The duration of the determined number of consecutive samples may be greater than a quarter, a half, one, one and a quarter or one and a half AC waveforms of the mains supply. Typically, the duration may be equal to or slightly larger then one AC waveform.

The input may be a first input. The power supply unit may have a second input. The first and second inputs may be configured to receive the mains power supply. The power supply unit may have a capacitor coupled between the first input and the second input. The power supply unit may have a drainage switch configured to selectively discharge the capacitor and allow sampling of the first or second inputs in response to receiving a control signal. The control circuit may be configured to provide the control signal to the drainage switch in order to sample the first or second inputs, which may be in accordance with the outcome of the comparison of the first and second sample values.

The drainage switch may be configured to couple the first or second inputs to ground in response to receiving the control signal.

The control circuit may be configured to provide the control signal to the drainage switch in response to values of a number of the plurality of samples being less than a threshold level. As a further alternative, the control circuit may be configured to provide the control signal to the drainage switch in response to a number of the plurality of samples having equal or successively decreasing values.

The control circuit may be configured to obtain the plurality of sample values over a period of time that spans more than a quarter, a half, one, one and a quarter or one and a half of an AC waveform of the mains supply.

The first and second samples may be consecutive samples. The second sample may be a subsequent sample to the first sample.

Each sample value may be a sample of a metric of the mains supply. The metric may be, or may be related to, a voltage between the first input and/or second input and ground.

The comparison may be configured to determine if the metric has increased between the first sample and the subsequent second sample. The control circuit may be configured to set the delay interval as a long delay, which is longer than a delay interval that is used if the metric has not increased. The control circuit may be configured to wait a default delay between the first sample and the second sample. The default delay may be a predetermined delay. The control circuit may be configured to set the delay interval to be equal to the default delay unless the outcome of the comparison indicates that the delay interval should be set to a longer delay. The longer delay may be longer than the default delay.

The extended delay may have a duration of more than 10, 32, 64 milliseconds or 0.5 seconds or may be equal to a duration of a quarter or a half of an AC waveform of the mains supply. If mains power is present, a rising voltage will be detected by taking a plurality of samples. An extended delay may then be imposed in response to the presence of the mains power. Another plurality of samples may then be taken after the extended delay period has elapsed. The default delay may have a duration of 1 or 2 milliseconds. The extended delay may have a fixed relationship to the default delay, which can simplify circuit design in some examples.

According to a further aspect of the invention there is provided a power supply unit comprising the control circuit. The power supply unit can be a consumer power supply unit for plugging into a wall socket, for example a battery charger.

According to a further aspect of the invention there is provided an electronic device comprising the control circuit or the power supply unit.

According to a further aspect of the invention there is provided a method for sampling an input of a power supply unit, comprising:
sampling the input in order to obtain a first sample value and a second sample value;
comparing the first and second sample values to provide an outcome;
setting a delay interval depending on the outcome of the comparison of the first and second sample values; and
sampling the input in order to obtain a third sample value after the delay interval has elapsed.

The method may further comprise:
setting the delay interval as a first delay interval if the outcome of the comparison is indicative of the second sample value being smaller than or equal to the first sample value; and
setting the delay interval as a second delay interval if the outcome of the comparison is indicative of the second sample value being larger than the first sample value.

The method may further comprise grounding the input of the power supply unit in response to a plurality of sample values being less than a threshold level. The method may further comprise grounding the input of the power supply unit in response to a number of the plurality of sample values having equal or successively decreasing values.

The method may further comprise:
considering the second sample value as a first sample value in an immediately subsequent iteration of the method if the delay interval is set as a first delay interval; or
considering the third sample value as a first sample value in an immediately subsequent iteration of the method if the delay interval is set as a first delay interval.

It will be appreciated that the control circuit functionality may be provided at least in part by a computer program.

There may be provided a computer program, which when run on a computer, causes the computer to configure any apparatus, including a circuit, controller, converter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

The invention will now be further described by way of example only with reference to the accompanying drawings in which.

Figure 1:
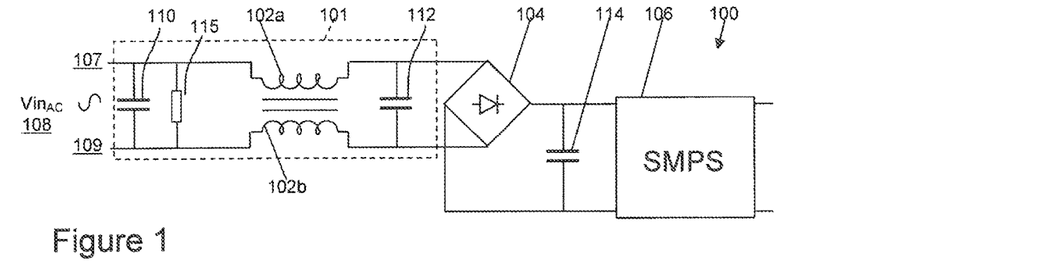
FIG. 1 illustrates a power supply unit with a resistor provided across its input terminal.

FIG. 1 illustrates a conventional power supply unit 100 for connecting to a mains supply 108. The power supply unit 100 has a filter 101, a bridge rectifier 104 and a switched mode power supply (SMPS) converter 106.

The power supply unit 100 has a first input 107 and a second input 109 for receiving the mains supply 108. The filter 101 is configured to be coupled between the inputs of the bridge rectifier 104 and the first and second inputs 107, 109 of the mains supply 108. The filter 101 can compensate for switching noise generated by the SMPS converter 106, so that such noise is not fed back to the mains supply 108.

The bridge rectifier 104 provides a rectified mains signal to the SMPS converter 106. A further capacitor 114 is also provided in parallel with the output connections of the bridge rectifier 104 to smooth the rectified voltage waveform.

The filter 101 comprises a mains side filtering capacitor 110, a converter side filtering capacitor 112 and a pair of inductor windings 102a, 102b that have a common core.

Each of the inductor windings 102a, 102b has a mains side terminal and a converter side terminal. The mains side terminals of the respective windings 102a, 102b are configured to be coupled to the first and second inputs 107, 109 of the mains supply 108. The converter side terminals of the respective windings 102a, 102b are coupled to input connections of the bridge rectifier 104.

The mains side filtering capacitor 110 has a first plate coupled to the first input of the power supply and the mains side terminal of a first winding 102a. The mains side filtering capacitor 110 has a second plate coupled to the second input of the power supply and the mains side terminal of a second winding 102b. The converter side filtering capacitor 112 has a first plate coupled to the first winding 102a. The converter side filtering capacitor 112 has a second plate coupled to the second winding 102b.

When the mains supply 108 is provided to the power supply unit 100, converter noise is cancelled out or reduced by the mains side filtering capacitor 110 and the converter side filtering capacitor 112, which act as high pass channels for the converter noise. Indeed, noise from the converter is shorted by the filtering capacitors 110, 112. The filtering capacitors can be provided as X capacitors. The impedance of the first and second windings 102a, 102b provides a high impedance path to the mains supply 108 for switching noise and so most of the noise current flows through the filtering capacitor 112.

However, when the mains supply 108 is removed a potential is maintained across the filtering capacitors 110, 112 (except if the mains is disconnected at the moment when the AC supply is at 0 Vac). In this example, a resistor 115 is provided in parallel with the mains side filtering capacitor 110, 112 so that the mains side filtering capacitor 110, 112 can be discharged through the resistor 115. In this way, the potential stored in the capacitor 110, 112 is reduced. The reduction in stored charge is important to ensure that, for example, when a plug connected to the power supply unit is disconnected from the mains, a high voltage is not present across the terminals of the plug. Such a circumstance could present a danger to a user of the power supply unit.

However, the resistor 115 also acts as a load while the power supply unit 100 is connected to the mains supply 108 in normal use. In this situation, the load provided by the resistor 115 is undesirable as it increases the power consumption of the power supply unit without providing any benefit to the operation of the power supply, especially when no-load input power consumption is required to be very low.

Figure 2:
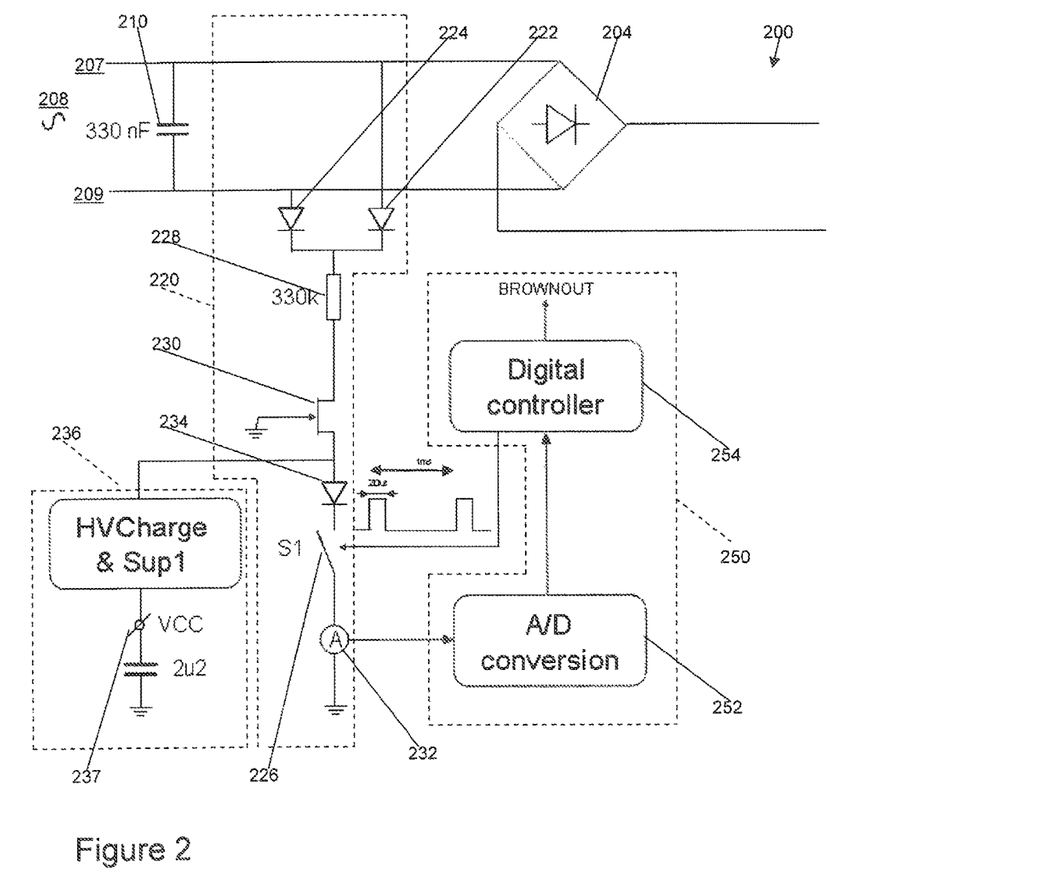
FIG. 2 illustrates a schematic of a control circuit where discharge of a filter capacitor can be actively controlled using an analog to digital converter (ADC) and a digital controller.

FIG. 2 illustrates a schematic drawing of another power supply unit 200. The resistor of the power supply unit of FIG. 1 has been removed so that the power consumption of the power supply unit 200 is reduced during normal operation.

The power supply unit 200 has a first input 207 and a second input 209 for receiving the mains supply 208. A filtering capacitor 210 is coupled between the first input 207 and the second input 209, although it will be appreciated that other filtering components described above in relation to FIG. 1, such as the capacitor 114, inductor 102 and capacitor 112, may also be provided in other circuits described herein. A bridge rectifier 204 is coupled to the inputs 207, 209 of the power supply unit 200 and provides output connections for a switched mode power supply converter (not shown).

The power supply unit 200 of this example also comprises a sampling and discharge path 220, a circuit supply 236 and a control circuit 250. The sampling and discharge path 220 provides a configurable path between the inputs 207, 209 of the power supply unit 200 and ground through a drainage switch 226. The control circuit 250 is configured to control the drainage switch 226. The circuit supply 236 provides a supply voltage for the control circuit 250.

The sampling and discharge path 220 is provided between the respective first and second inputs 207, 209 and ground. The sampling and discharge path 220 can be used to sample the voltage at the inputs 207, 209 of the power supply unit 200 in order to obtain sample values. Sample values can be taken both in no-load and load conditions. In addition, the sampling and discharge path 220 can also be used to at least partially discharge the filtering capacitor 210 under no load conditions.

The sampling and discharge path 220 comprises a first diode 222, a second diode 224, a drainage switch 226 and an ammeter 232, which may also be referred to as a current meter or ampere meter. The anode of the first diode 222 is coupled to the first input 207. The anode of the second diode 224 is coupled to the second input 209. The cathode of the first diode 222 is coupled to the cathode of the second diode 224. In this way, a rectified version of the mains input voltage 208 is provided at the common cathode connection of the first and second diodes 222, 224.

The common cathode connection of the first and second diodes 222, 224 is coupled to a first terminal (which may be referred to as a power connection) of the drainage switch 226. A second terminal (which may be referred to as a ground connection) of the drainage switch 226 is coupled to ground via the ammeter 232. The drainage switch 226 is operated (thereby connecting or disconnecting the first and second terminals) in response to receiving a control signal from the control circuit 250. As will be discussed below, closing the switch under no supply conditions can discharge the capacitor 210. Temporarily closing the switch under mains power supply conditions enables sampling of the input voltage to the power supply unit 200, in order to determine whether or not the mains supply is connected.

When the drainage switch 226 is closed, the sampling and drainage path 220 is complete and a current is drawn from the mains inputs 207, 209 to ground through the ammeter 232, which measures the current drawn. The drawn current is proportional to the potential difference between the first and second inputs 207, 209 and ground.

The control circuit 250 comprises an analog to digital converter (ADC) 252 and a controller 254. The control circuit 250 is configured to repeatedly sample a metric, such as the input voltage, or any parameter representative of the input voltage, of the power supply inputs 207, 209. In this example, the sampled metric of the power supply inputs 207, 209 is the current through the ammeter 232, which relates to the mains input voltage due to resistor 228. The controller 254 of the control circuit 250 is configured to provide a control signal to operate the drainage switch 226. The control signal is set in accordance with sampled value of the metric. Where the drainage switch 226 is provided by a transistor, the control signal is provided to the gate or base of the transistor.

The ammeter 232 may also be considered to be part of the control circuit 260, although the ammeter 232 is illustrated separately from the control circuit 250 in this example.

In FIG. 2, a number of non-essential components are shown in the sampling and discharge path 220. Examples of such components include a JFET 230 and third diode 234. It will be appreciated that the ammeter 232 may also be considered as optional as any method of sampling a metric that relates to the input 207, 209 may be used in other examples.

A resistor 228 is provided in series between the common cathode connection of the first and second diodes 222, 224 and the power connection of the drainage switch 226. The resistor 228 is used to convert the input voltage into a current that is convenient for measuring. The resistor 228 also limits the current that can be drawn by the sampling and discharge path 220 so as to protect components such as integrated circuits (lCs) and transistors that are connected to the sampling and discharge path 220. The brownout voltage level and low level mains voltage can be set/adjusted.

The conduction path (between the drain and the source) of the NET 230 is provided in series between the resistor 228 and the power connection of the drainage switch 226. The gate of the JFET 230 is coupled to ground. The JFET is used to separate the high voltage components (above the JFET 230) from the low voltage components (below the JFET 230) and may be provided as part of an integrated circuit along with other components shown in FIG. 2. The voltage at the drain of the JFET can be more than 500V, the voltage at the source of the JFET is a lower voltage (eg 25V). So all circuitry below the JFET can have a lower voltage rating.

The third diode 234 is provided in series between the JFET 230 and the power connection of the drainage switch 226. The anode of the third diode 234 is coupled to the conduction path of the JFET 230.

The circuit supply 236 is provided between ground and the anode of the third diode 234. The circuit supply 236 (also referred to as an HVCharge & SUP1 circuit) receives power from the inputs 207, 209 of the power supply unit 200 in order to provide power for the control circuit 250. This is referenced by the VCC node 237 in the circuit supply 236, which is the supply voltage for the control circuit 250.

Generally, the circuit supply 236 is only used at start-up of the power supply unit. To continuously supply an IC that provides the functions of the control circuit 250 directly via the mains is very inefficient. However, at start-up the mains voltage is the only available mains voltage. Once the system has started up, the IC can be supplied via the SNIPS supply itself. A switch could be provided between the circuit supply 236 and VCC node 237.

In general, any of the components that are illustrated in FIG. 2 as being part of the sampling and discharge path 220 or circuit supply 236 could also be considered to be part of the control circuit 250.

The control circuit 250 provides the control signal to close the drainage switch 226 in response to a value of one or more of the plurality of samples of the metric. That is, the ADC 252 and controller 254 can together determine if the potential between the first and second inputs 207, 209 indicates that the power supply has been disconnected from the mains. In order to perform this determination, the ADC 252 and controller 254 can measure a current between the first or second inputs 207, 209 and ground. In response to a determination of disconnection, the controller 254 can provide the control signal to close the sampling and drainage switch 226 and so safely discharge the potential stored on the filter capacitor 210 and any other charge storing filtering components that may be provided. The discharge of a filter capacitor 210 can therefore be actively controlled using the ADC 252 and the digital controller 254.

The control circuit 250 is configured to sample the first or second input 207, 209 (depending upon which of the first and second diodes 222, 224 is conducting) in order to obtain a first sample. The sampling is performed by the controller 254 sending a control signal to close the drainage switch 226 for a predetermined period of time that may be a short period such as 20 μs. When the switch is closed, current flows through the sampling and discharge path 220 through the resistor 228 and is detected by the ammeter 232. The ADC 252 digitizes the signal from the ammeter 232 to provide a digitized sample representative of the voltage between the inputs 207, 209 and ground during the time that the drainage switch 226 is closed. The quantization threshold level for the ADC 252 can relate to the brown-out level and mains low level of the power supply. In this, way a simple ADC 252 can be provided in order to reduce circuit complexity and cost. In addition, the ADC 252 output may be provided to other components as an indicator of whether the supply is in excess of the brown out level or mains low level.

The control circuit 250 repeats the sampling step to obtain a subsequent second sample. The second sample can take place at a delay interval after the first sample. The delay interval may be a default, or predetermined, delay interval.

The control circuit 250 compares the first sample with the second sample to provide an outcome of the comparison. The outcome may be indicative of whether or not the voltage at the first or second input 207, 209 of the power supply unit 200 has increased between the first sample and the subsequent second sample.

The control circuit 250 then sets the delay interval depending on the outcome of the comparison of the first and second samples. The control circuit 250 can be configured to apply a longer delay interval if the voltage has increased between the first sample and the subsequent second sample than if the voltage has not increased between the samples for reasons set out below. This is on the assumption that the power supply unit 200 is still connected to the mains supply 208 if the voltage has increased.

The control circuit 250 obtains a third sample after the delay interval has elapsed since the second sample was taken. The process of sampling the third and subsequent further samples is similar to that described for obtaining the first and second samples above.

Figure 3A:
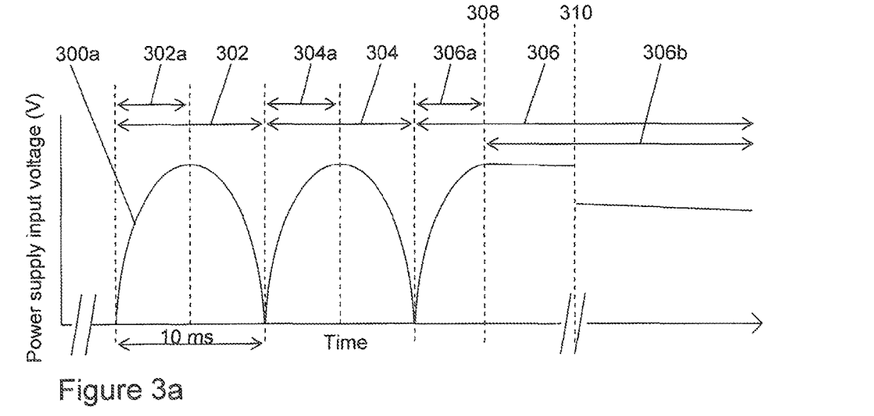
FIG. 3a illustrates a power supply input voltage against time.
Figure 3B:
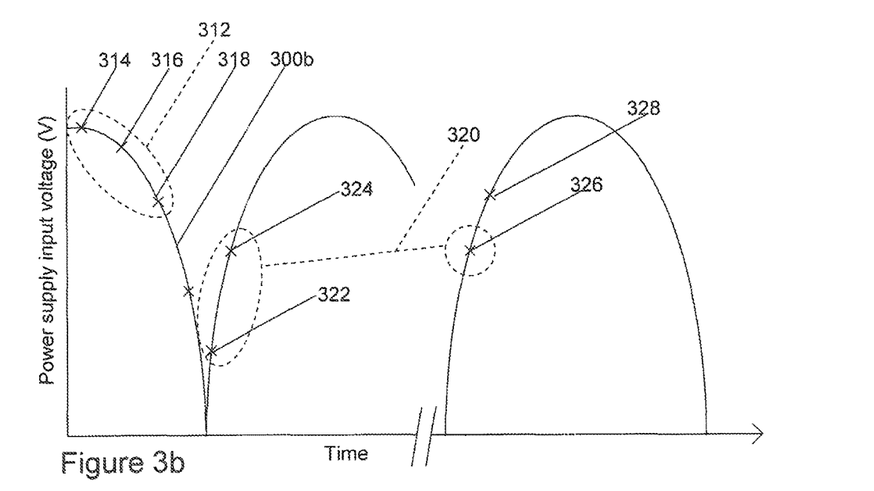
FIG. 3b illustrates a sampling scheme for a power supply input voltage.

A contribution of such examples lies in the control circuit 250 being configured to determine a sign of a difference between two of a plurality of samples of the metric and suspend the repeated sampling if the difference has a specific sign. In this example, the controller is configured to compare consecutive digitized samples and look for an increase in the current through the ammeter 232. It will be appreciated that the current is proportional to the voltage between the supply inputs and ground, due to the resistor 228. An increase in the voltage between two consecutive samples indicates that the mains supply is present, and so further sampling can be performed less frequently. That is, sampling may be suspended for a relatively long time. The suspension of sampling enables the control circuit 250 to avoid or reduce unnecessary sampling of the mains supply and so reduce the power consumption of the power supply unit 200. The suspension of sampling without compromising the safety of the power supply is described below with reference to FIG. 3. As will also be discussed in further detail with regard to FIGS. 3 to 5, the controller can provide indications of whether the power supply voltage is at a "low level" or a "brown-out level" using information determined from one or more of the plurality of samples of the metric.

FIG. 3a illustrates a plot of voltage 300a at the common cathode connection of the first and second diodes shown in FIG. 2. This voltage represents the rectified power supply input against time and is the signal that may be received by the ammeter of FIG. 2 when the sampling and discharge switch is closed. The voltage 300a is an example of a metric of the power supply input. Other examples of such a metric include any quantity related to the voltage. The voltage 300a relates to first, second and third portions 302, 304, 306 of the rectified power supply cycle. The first and second portions 302, 304 relate to complete half periods of the power supply cycle.

It can be seen in FIG. 3a that mains power is supplied to the input of the power supply unit during the first and second half period portions 302, 304 and a rising voltage portion 306a of the third portion 306. The first half period portion 302 and second half period portion 304 are conventional rectified signals (any offsetting due to the diode is not shown in this example, and may be ignored for high voltage power supplies). The first half period portion 302 and second half period portion 304 each comprise a rising voltage portion 302a, 304a. In the rising voltage portion 302a, 304a, the first differential of the voltage is positive and so a change in the voltage between two consecutive samples taken within the same rising voltage portion 302a, 304a shows an increase in the voltage.

The third portion 306 also comprises a third rising voltage portion 306a. However, during the third portion 306, the mains supply is disconnected at the time shown with reference 308 in FIG. 3a. After the mains supply is disconnected, a voltage is present across the inputs of the power supply due to the charge stored by the filtering capacitor. The voltage across the capacitor will therefore generally remain static (assuming leakage current is small), unless its charge is drained. The voltage can also slowly decrease as the capacitor is discharged by SMPS components. However, at no load conditions this discharge is minimal. At a minimum input voltage the SMPS is switched off and so this discharge of the filtering capacitor is stopped. The system therefore cannot rely on the SMPS components and parasitic leakages to drain the filtering capacitor. A period 306b in which the voltage across the capacitor is generally static is shown (including a discontinuity 310 along the time axis) in FIG. 3.

FIG. 3b shows an example of a sampling scheme for a control circuit. The sampling scheme is superimposed over a rectified input voltage 300b of a mains supply. A first group of samples 312 and second group of samples 320 are labelled in FIG. 3b.

A control circuit that is configured to determine a sign of a difference between two of the plurality of samples of the metric can look for increases in the metric. If an increase is found between a sample and a subsequent sample, this unambiguously indicates that a mains supply is present. An example of such an operation is explained below with reference to the first sample group 312.

The control circuit samples the input in order to obtain a first sample 314. Subsequently to obtaining the first sample, the control circuit samples the input in order to obtain a second sample 316. The control circuit then compares the first and second samples 314, 316 to provide an outcome and sets a delay interval in accordance with the outcome. In this case, the voltage of the second sample 316 is lower than the voltage of the first sample 314; this could be due to either the mains voltage having been removed or (as is the case here) because the samples were obtained during a falling period of the AC cycle. The control circuit therefore cannot unambiguously determine from the first and second samples 314, 316 whether or not a mains supply voltage is present. The control circuit may therefore set the delay interval to be relatively short, which may involve continuing to sample at the previous sampling rate.

A third sample 318 is obtained after the delay interval has elapsed. In this example, the delay interval between the first sample 314 and the second sample 316 is the same as the delay between the second sample 316 and a third sample 318. The third sample is at a lower voltage than the second sample 316. However, as less than a quarter of an AC cycle of the mains supply has been sampled, the control circuit still cannot unambiguously determine whether the decrease in sample values is due to the mains voltage having been removed or because the samples were obtained during a falling period of the AC cycle. Further samples are therefore required. The control circuit can, when taking further samples, consider the second sample 316 as a first sample, and repeat the above process.

In FIG. 3b, a subsequent fifth sample 322 has been taken and is shown as the first sample of the second sample group 320. Comparison between the fifth sample 322 and a sixth sample 324 shows that a rise in voltage is present. In such a situation the control circuit can therefore suspend the repeated sampling for a duration that is longer than it would otherwise wait before taking the next sample. This is on the basis that the power supply unit is known to be connected to a mains supply. That is, the delay interval between the sixth and a seventh sample 324, 326 can be set to be longer than the delay between the earlier samples. The reason for this is that it is considered safe, under certain operating regimes, for there to be a high potential across the power supply for a period that might be as great as one or two seconds.

Alternatively, if the sampled values continue to decrease or stay the same for a minimum, or threshold, number of sampling periods that relate to a period of time, then it may be determined that no mains power is present and the filter capacitor at the input of the power supply unit should be discharged. Such a predetermined period of time may be slightly longer than a quarter of the period of the mains AC supply voltage. In this way, it is ensured that the samples considered cannot all be within a single falling voltage portion of the rectified sinusoidal waveform. Typically, the predetermined period is much longer (32 ms, for example). The provision of a longer predetermined period allows the system to accommodate a mains dip condition in which the mains supply is not present for a certain period, such as 1 AC cycle. Some regulatory regimes require that the system should not react to a dip in the mains supply of around 20 ms. So a minimum predetermined period should actually be larger than 20 ms plus a quarter of a AC cycle period. A suitable predetermined period may therefore be 32 ms, with a provision of some margin.

The controller can determine if a power supply has been disconnected relatively quickly (within 1 AC cycle) compared to such a timescale, the capacitor can then be discharged at a relatively rapid rate (90% discharge may take around 0.1 s). The controller may therefore reduce the power drawn from the mains supply by suspending sampling for up to a period marginally less than the operating regime will tolerate, before resuming the sampling process.

The control circuit can, when taking further samples, consider the seventh sample 326 (rather than the sixth sample 324) as a first sample, and repeat the above process. The controller may not compare the sixth and seventh samples 324, 326 in the further sampling process because the outcome of the comparison between the fifth and sixth samples 322, 324 showed an increase in voltage, a comparison between the sixth and seventh samples 324, 326 may not yield any useful information. The controller may compare the seventh sample 326 with an eighth sample 328 that is taken after a default interval and determine that the voltage has increased between the seventh and eighth sample 326, 328. The controller may therefore set the delay interval to be a longer delay interval than the default delay interval.

The control circuit described herein can be advantageous as it does not require the controller to maintain high frequency sampling in order to determine the state of the power supply when it is determined that a mains power supply is present. It will be appreciated that some power is drained from the mains supply each time the mains supply is coupled to ground by closing the drainage switch. The power consumption of the power supply unit is therefore reduced by avoiding sampling that can be considered unnecessary. Such control circuits therefore allow a more power efficient power supply unit to be provided.

Figure 4A:
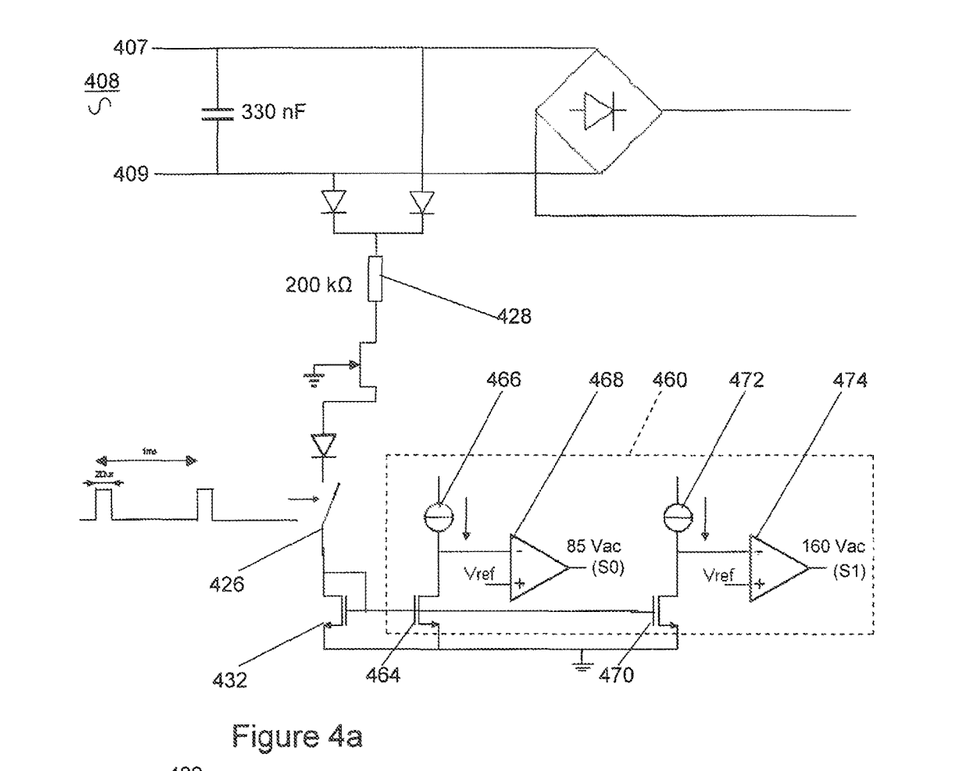
FIG. 4a illustrates a schematic of a control circuit featuring an example of the ADC of FIG. 2.

FIG. 4a illustrates a schematic of a power supply unit comprising an ADC 460 and an ammeter transistor 432. It will be appreciated that additional filtering components shown in FIG. 1 may also be provided in this example. The components other than those of the ADC 460 and ammeter transistor 432 relate to those of the power supply unit of FIG. 2 and will not be discussed in detail further here. Corresponding reference numerals are used to refer to similar components in FIGS. 2 and 4a.

The ammeter transistor 432 has a conduction channel provided in series between the drainage switch 426 and ground. In this example, the ammeter transistor 432 is a field effect transistor. The conduction channel of the field effect transistor 432 is provided by its source-drain channel. The source of the ammeter transistor 432 is coupled to ground. The drain of the ammeter transistor 432 is coupled to the gate of the ammeter transistor 432 and also to the drainage switch 426.

The ADC 460 comprises a brown-out level mirror transistor 464, a brown-out level current source 466, a brown-out level comparator 468, a low level mirror transistor 470, a low level current source 472 and a low level comparator 474.

The brown-out level mirror transistor 464 and the low level mirror transistor 470 are also provided as FETs, in this example. The brown-out level mirror transistor 464 and the low level mirror transistor 470 have respective gate connections coupled to the gate of the ammeter transistor 432. The brown-out level mirror transistor 464 and the low level mirror transistor 470 have respective source connections coupled to ground.

Reference voltages are provided to the inverting inputs of the brown-out level comparator 468 and the low level comparator 474. The Vref values for the brown-out level comparator 468 and the low level comparator 474 can be set at arbitrary reference voltages.

If the mains voltage is high, this gives a higher current. As a result the input voltage of the comparator is low and the output voltage of the comparator should be high.

The drain of the brown-out level mirror transistor 464 is coupled to an inverting input of the brown-out level comparator 468. The brown-out level current source 466 is also provided to the inverting input of the brown-out level comparator 468. The brown-out level comparator 468 produces a high output (sample bit S0=1, as discussed below) when the sampled supply voltage is greater than 85 Vac.

The drain of the low level mirror transistor 470 is coupled to an inverting input of the low level comparator 474. The low level current source 472 is also provided to the inverting input of the low level comparator 474. The low level comparator 474 produces a high output (sample bit S1=1, as discussed below) when the sampled supply voltage is greater than 160 Vac.

The current through the ammeter transistor 432 relates to the voltage at either the first or second input 407, 409 (whichever is the highest) divided by a resistance of the resistor 428 (neglecting any voltage drop in this path of the diode, etc). The current through the ammeter transistor 432 is copied to transistors 464, 470. If the ammeter current is smaller then the brown-out level current source 466 is larger then the current into transistor 464. This is, of course, not possible because the difference between the two current has nowhere to go. In such a situation no current can flow at the inputs of the brown-out level comparator 468.

The voltage at the inverting input of the brown-out level comparator 468 (between brown-out level mirror transistor 464 and brown-out level current source 466) goes to a high voltage. If the current source 466 is supplied from a 5V supply, the intermediate voltage at the inverting input of the brown-out level comparator 468 will go to a voltage close to 5V, causing the brown-out level current source 466 to deliver a smaller current then its default value. If the current from the brown-out level current source 466 is larger than the current from the brown-out level mirror transistor 454 then the voltage at the inverting input of the comparator is high and the output of the comparator 468 is active high (S0=1). When the current from the brown-out level current source 466 is smaller, then the voltage goes to a level close to zero and the output of the comparator 468 is active low (S0=0).

Similar considerations apply to the configuration of the low level comparator as described above for the brown-out level comparator. The reference voltages applied to the comparators 468, 474 are therefore mostly at a level between 0 and 5V (2.5V may be chosen).

In this way, the brown-out level comparator 468 and the low level comparator 474 therefore provide a 2-bit digital output (S1, S0) that corresponds to a current that is related to the potential of the inputs 407, 409 of the power supply unit with respect to ground.

Figure 4B:
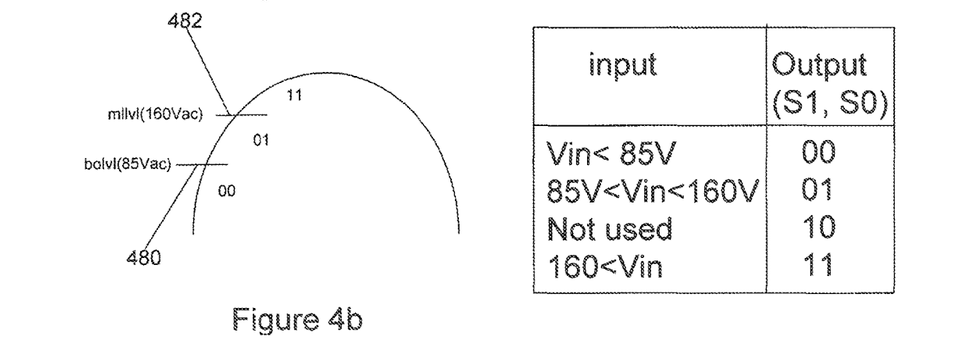
FIG. 4b illustrates the mapping of output values of the ADC to input conditions.

FIG. 4b illustrates the mapping of output values of the ADC 460 to input voltage conditions. If the input voltage from the mains supply is less than a "brownoutlevel" 480 of 85 Vac then the 2-bit ADC output is 00 (S1=0, S0=0). If the input voltage from the mains supply is greater than the "brownoutlevel" 480 but less than a "mainslowlevel" 482 of 160 Vac then the 2-bit ADC output is 01 (S1=0, S0=1). If the voltage is greater than the "mainslowlevel" 482, the 2-bit ADC output is 11 (S1=1, S0=1). The output 10 (S1=1, S0=0) is not used in this example.

Figure 4C:
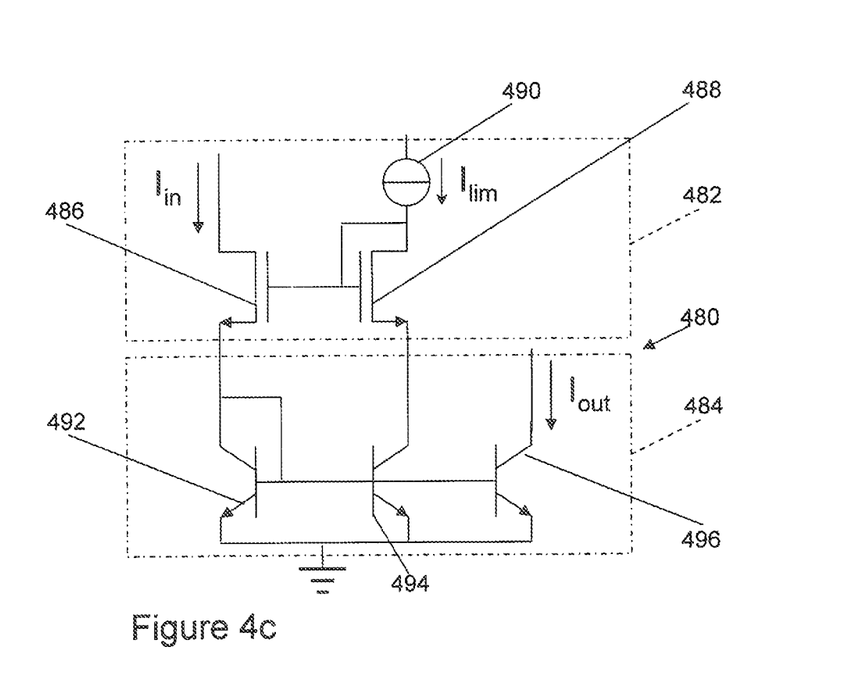
FIG. 4c illustrates a circuit diagram of a current mirror with current limiting capability.

FIG. 4c illustrates a circuit diagram for a current mirror 480 that acts as a current limiting circuit configured to limit the maximum current that can pass through the drainage switch to a limited current level.

Use of such a current mirror with the ammeter transistor 432 and ADC 460 arrangement discussed above with reference to FIG. 4a can further reduce the power consumption of the control circuit. When a supply voltage above the mains low level voltage of 160 Vac is detected it is unnecessary for current above that level to flow through the resistor 428 of FIG. 4a. The limited current level may therefore be set to correspond to at least a current that would pass through the sampling and discharge path when sampling a mains supply at a mains low level voltage.

The circuit of FIG. 4c therefore limits further increases in the current through the resistor 428. In this way, power dissipation of the circuit can be further limited. Below the current limit, $I_{lim}$, the circuit of FIG. 4c behaves as a normal current mirror, where the output current, $I_{out}$, is equal to the input current, $I_{in}$. At or above the limit current, the circuit applies the constraint that $I_{out}=I_{in}=I_{lim}$.

The current mirror 480 comprises a first mirror stage 482 and a second mirror stage 484. The first mirror stage 482 comprises a limiting mirror transistor 486, a limiter transistor 488 and a limited current source 490. The limiting mirror transistor 486 and the limiter transistor 488 are FETs in this example.

The conduction channel of the limiting mirror transistor 486 may be coupled between the drainage switch 426 and (indirectly) ground. A gate of the limiting mirror transistor 486 is coupled to the limiter transistor 488.

The limited current source 490 is provided to a drain of the limiter transistor 488. The drain of the limiter transistor 488 is also coupled to the gate of the limiter transistor 488. The source of the limiter transistor 488 is (indirectly) coupled to ground.

It will be appreciated that an input current $I_{in}$ that can flow through the limiting mirror transistor 486 is limited by the current that flows through the limiter transistor 488, as well as the current supplied to a drain of the limiting mirror transistor 486.

The second mirror stage 484 allows the limited mirror current to be provided as an output current. The second mirror stage 484 comprises an input transistor 492, a first mirror transistor 494 and a second mirror transistor 496. The input transistor 492, the first mirror transistor 494 and the second mirror transistor 496 are provided by bipolar junction transistors in this example. A collector of the input transistor 492 is coupled to a source of the limiting mirror transistor 486 and an emitter of the input transistor 492 is coupled to ground. A current through a conduction channel (collector-emitter channel) of the input transistor 492 is therefore due to input current received at a drain of the input transistor 492, but limited to a maximum value determined by the limited current source 490.

Respective bases of the first and second mirror transistors 494, 496 are coupled to the base of the input transistor 492. Respective emitters of the first and second mirror transistors 494, 496 are coupled to ground. A collector of the first mirror transistor 494 is coupled to the source of the limiter transistor 488.

If the input current, $I_{in}$, at the drain of the limiting mirror transistor 486 is smaller then the current source, $I_{lim}$ then the input current $I_{in}$ is copied from input transistor 492 to the first mirror transistor 494 so the first mirror transistor 494 draws a current equal to the input current, $I_{in}$. However, a higher current is simultaneously provided to the first mirror transistor 494 from the limiter transistor 488. As a result, a voltage between the input transistor 494 and the limiter transistor 488 increases, as does a gate voltage of the limiter transistor 488 and the limiting mirror transistor 486. The limiting mirror transistor 486 is therefore completely on.

If the current input current, $I_{in}$, is larger then the current source, $I_{lim}$, then the voltage between the input transistor 494 and the limiter transistor 488 decreases. As a result, the limiting mirror transistor 486 is partly switched off. Eventually the voltage at the gate of the limiting transistor 486 will be regulated to such a level that the input current $I_{in}$ equals the current source $I_{lim}$.

A collector of the second mirror transistor provides an output current that is a mirror of the input current as limited by the limited current source 490. The output current may be provided to the input of a comparator 468, 474 in the ADC 460 of FIG. 4a.

The components of the control circuit may be provided in an integrated circuit (IC). The IC may further comprise all of the components shown below the resistor 428 in FIG. 4a or the corresponding resistor in FIG. 2. The resistor 428 is coupled to a high voltage (HV) terminal, or pin, of the IC.

During voltage surges, for example if a lightning strike occurs, the voltage at the HV terminal can become very high. An internal clamp can be provided in the IC to limit the voltage at the HV terminal. However, due to the voltages that are applied to the HV terminal during events such as lightning strikes, internal damping alone may be insufficient.

Figure 5:
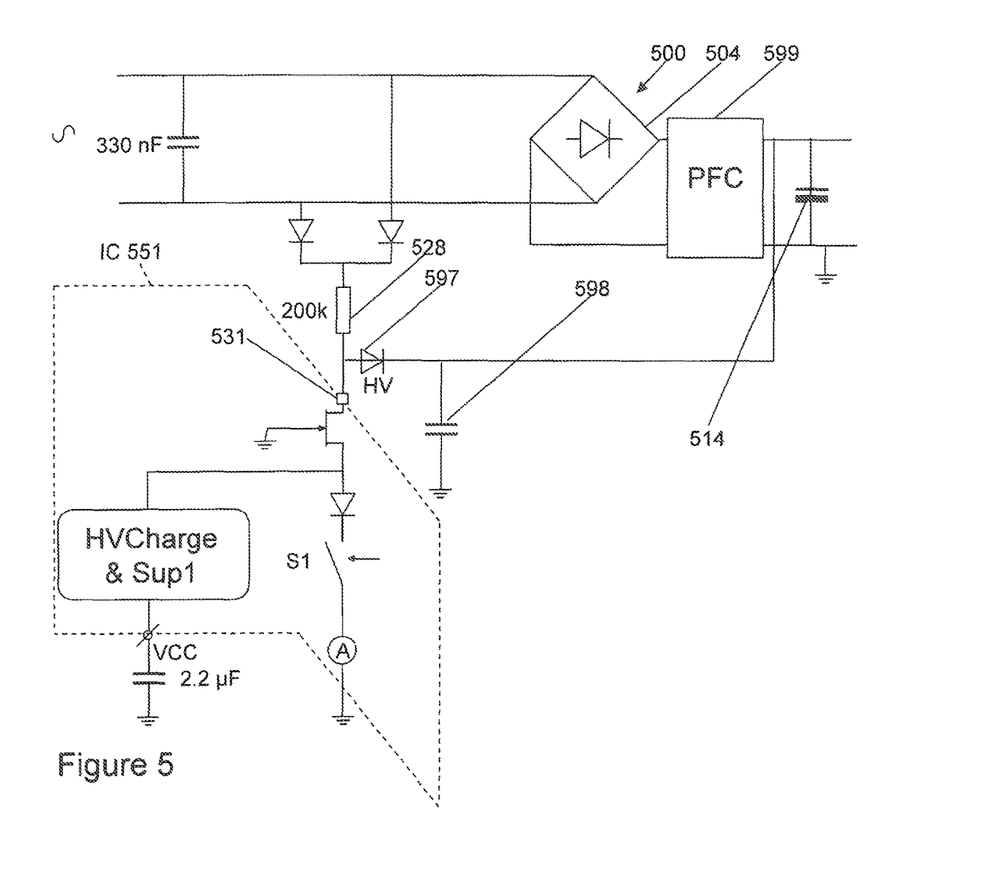
FIG. 5 illustrates an arrangement for providing high voltage protection to a control circuit.

FIG. 5 illustrates an arrangement for providing high voltage protection to a power supply unit 500 comprising an integrated circuit (IC) 551 that includes the components shown within the dotted line and a control circuit (not shown). The IC 551 has a high voltage input terminal 531 as well as VCC and ground terminals. Corresponding reference numerals are used for features of FIG. 5 that are similar to those of FIG. 2, which will not be discussed in further detail here.

The power supply unit 500 further comprises a high voltage (HV) diode 597. The anode of the HV diode 597 is coupled to the high voltage input terminal 531 and the cathode of the HV diode 597 is coupled to an output of an optional power factor correction (PFC) circuit 599, which is an example of a SMPS. The cathode of the HV diode 597 is also coupled to a plate of an elcap output smoothing SMPS capacitor 514.

An optional capacitor 598 is also provided in this example between the cathode of the HV diode 597 and ground. The optional capacitor 598 provides a route for high frequency, high voltage signals to be directed to ground. The provision of the optional capacitor 598 close to the IC 551 means that it is allowed to use long inductive wires, which would otherwise result in higher clamping voltages.

Figure 6:
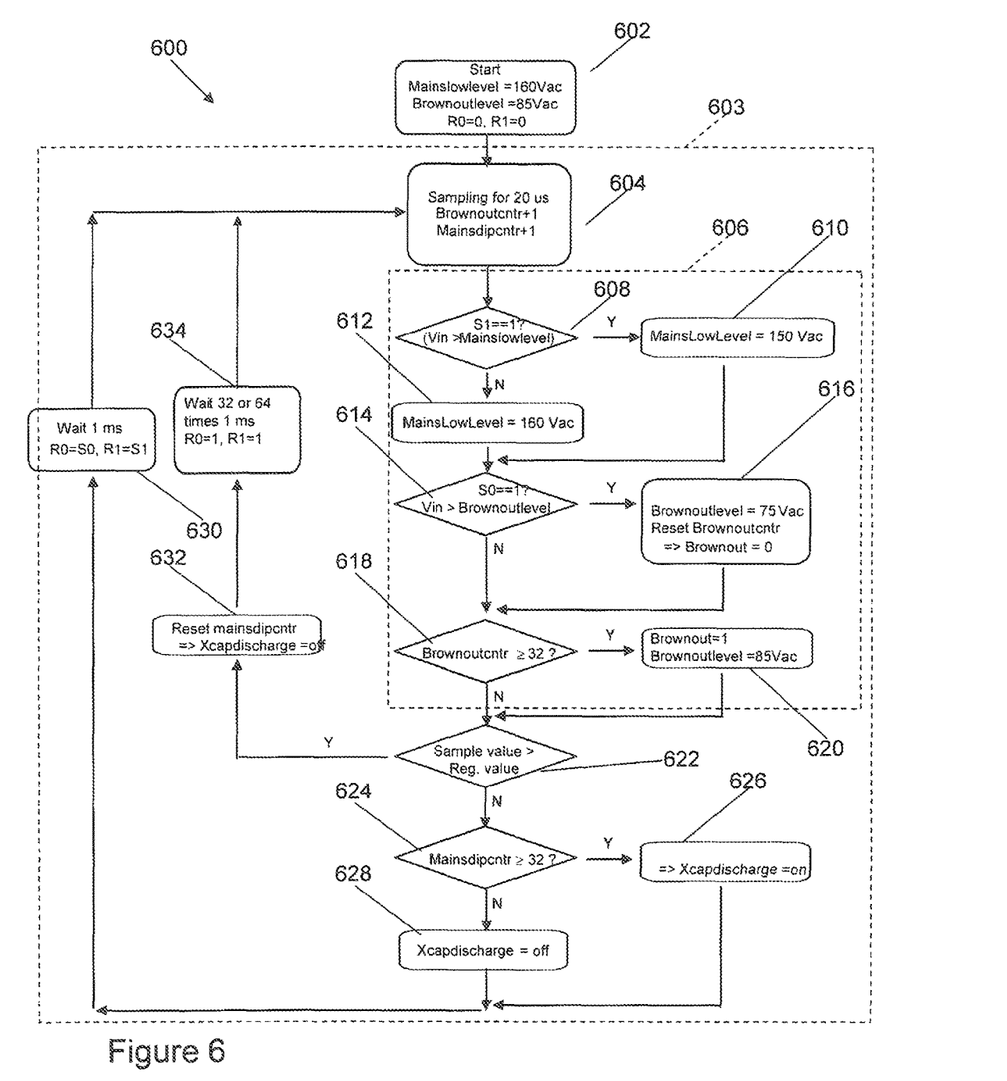
FIG. 6 illustrates a flow chart that can be used in a digital controller.

FIG. 6 illustrates a flow chart for a process 600 that can be performed by a control circuit, such as the control circuit illustrated in FIGS. 2 or 4a. The process 600 relates to the functionality of:

sampling the supply voltage to provide indictors if the supply voltage drops below a mains low level or a brownout level; and suspending sampling in response to detecting the rising side of a rectified mains supply sine wave.

The process 600 has a number of steps. The process uses a number of internal variables, including:

"Mainslowlevel", a voltage level that is considered to be a low level mains voltage;

"Brownoutlevel", a voltage level that is considered to be a brown-out mains voltage;

"Mainsdipcntr", a counter that can be used to store the number of successive samples that show a non increasing mains input voltage;

"Brownoutcounter", a counter that can be used to store the number of successive samples that show a voltage below Brownoutlevel;

"R0" and "R1", register values that are used to store sample bits corresponding to S0 and S1 of the ADC, as discussed above with reference to FIGS. 4a and 4b; and "Xcapdischarge", a boolean variable that is set to "on" when the drainage switch is closed for the purpose of draining the filter capacitor.

The process also provides output indicators that can be used by other components such as the SMRS and discharge switch shown in FIG. 2. The indicators include:

"Brownout", which can be provided to the SMPS converter when a brown-out power supply condition is detected; and a control signal that causes the drainage switch to be closed when the "Xcapdischarge" is "on".

Initially, the process starts at step 602 and values of variables are initialized such that:

Mainslowlevel==160 Vac;
Brownoutlevel=85 Vac;
Mainsdipcntr=0
Brownoutcounter=0
R0=0; and
R1=0.

After the process starts, the process proceeds to a main loop 603. A sample of the mains supply voltage is taken at a sampling step 604. Taking a sample is achieved by closing the drainage switch for a 20 microsecond period and taking a reading using an analogue to digital converter (ADC), such as that shown in FIG. 4a, during the sampling period. It will be appreciated that a different sampling period could be used in other examples. The ADC maps the mains supply voltage sample to a digital value as discussed with regard to FIG. 4b and provides digitized sample bits (S1, S0). S0 relates to the output of the brown-out level comparator and S1 relates to the output of the low level comparator in the example shown in FIG. 4a. The counters "Mainsdipcntr" and "Brownoutcounter" are each incremented by one count at the sampling step 604.

After the sampling step 604 is complete, the process initiates an optional sub-sequence 606 that relates to the process of providing output indications, if required, in accordance with the comparison of the absolute level of the input voltage with the "Mainslowlevel" and the "Brownoutlevel". The sub-sequence 606 is not related to the process of suspending sampling in response to detecting the rising side of a rectified mains supply sine wave.

The sub-sequence 606 contains a number of steps 608 to 620. At step 608, the equality "S1==1" is tested. This equality will evaluate to true if the input power supply voltage is greater than the "Mainslowlevel". If the equality is true then the "Mainslowlevel" is set to 150 Vac at step 610. If the equality is false, the "Mainslowlevel" is set to 160 Vac at step 612. After step 610 or step 612, the process proceeds to step 614.

At step 614 the equality "S0==1" is tested. This equality will evaluate to "true" if the input voltage is greater than the "Brownoutlevel". If the equality is "true" then the "Brownoutlevel" is set to 75 Vac at step 616. Also, the "Brownoutcntr" counter is set to 0 and the "Brownout" output indicator is set to 1 at step 616. After step 616, or if the equality is "false", the process proceeds to step 618.

At step 618, the equality "Brownoutcntr is greater than or equal to 32" is tested. The value 32 is one of a number of suitable variables. This value (32) corresponds to a number of successive samples that exceeds a predetermined period of time. The predetermined period is sufficiently long to ensure that a peak (brownout level is defined by the peak of the mains) portion of the power supply cycle is detected if a mains supply is present. The predetermined period is 32 ms in this example. The main loop 603 must therefore have been cycled through at least 32 times before this step can evaluate to "true". A lower limit for this value can be determined by dividing the duration of half of the AC cycle (10 ms for a 50 Hz cycle) by the delay interval between taking each sample (1 ms in this example, as will be discussed later with regard to step 630) plus at least one delay interval. Half of a cycle may be needed as the peak occurs once per half cycle. A positive dV/dt is a quarter of a cycle, but the brownout level is measured at the peak. The example value of 32 is sufficient to sample around two periods of a 60 Hz AC cycle.

If the equality at step 618 is "true", the "Brownout" output indicator is set to 1 and the "Brownoutlevel" is set to 85 Vac at step 620.

Varying the values of the "Brownoutlevel" and the "Mainslowlevel" during the sub-sequence 606 allows for hysteresis in the determination of whether or not these values have been exceeded.

After step 620, or after step 618 if the equality at step 618 is "false", the sub-sequence 606 returns to the main loop 603 at step 622.

At step 622, the equality "is the current sample value greater than the register value" is evaluated. That is, is (S1, S0)>(R1, R0). It should be noted that this is a comparison between a current value of an input voltage sample (or other metric) and a previous value of the input voltage sample, rather than a comparison between the current value and an absolute, or fixed preset value. In the first iteration of the loop, the register values (R1, R0) were set to 0 at step 602.

If the current sample value (S1, S0) is not greater than the register value (R1, R0) at step 622 then the process tests, at step 624, whether "Mainsdipcntr" is greater than or equal to a threshold, which in this example 32. The value for the threshold can be the same value to that chosen for step 618 above, for the same reasons. If the equality at step 624 evaluates to "true" then the input voltage has not risen within a period of time greater than a quarter of a clock cycle, and so it is determined that no mains supply is present at the inputs of the power supply. "Xcapdischarge" is set to "on" at step 626 in order to close the drainage switch and so discharge the potential stored across the filter capacitor of the power supply unit.

The discharge time that it takes for the voltage stored across the input of the power supply to be reduced to a level that is considered safe depends on the capacitance of the filter capacitor and the resistance of the resistor in the discharge path, as will be appreciated by those skilled in the art. The maximum discharge time may be chosen to be around a few tenths of a second by choosing suitable values for the filter capacitor and discharge path resistor.

If the equality at step 624 evaluates to "false" then the drainage switch is set, or maintained, in the open position at step 628 (Xcapdischarge is set to "off"). Step 628 is encountered when more samples are required in order to determine whether or not the voltage has not increased for over a quarter of a rectified AC cycle (or the number of samples selected for the value in step 624).

After step 626 or step 628, the process proceeds to step 630. At step 630, the register value (R0, R1) is set to take the values of the current sample bits (R1=S1 R0=S0). A sampling delay interval of 1 millisecond is waited at step 630. This sampling delay interval can be considered as a default, or "short" delay. The process proceeds then to step 604 where a subsequent sample is taken after the delay interval of step 630 has elapsed, thus concluding a traversal of the main loop 603.

Alternatively, if the current sample value is found to be greater than the register value at step 622 then the input voltage has increased since the last sample was taken. An increase in the input voltage is indicative that an AC mains voltage is present at the input of the power supply unit (and that the waveform has been sampled while the voltage is increasing). If this is the case, "Mainsdipcntr" is set to 0 and the drainage switch is opened, or left open, depending on its previous state at step 632 Xcapdischarge is set to "off"). The process then goes into suspension for 32 or 64 is milliseconds and the register value is set to 11 (R0=1, R1=1) at step 634. That is, a delay interval of 32 or 64 milliseconds is provided at step 634 instead of the 1 milliseconds delay interval used at step 630. The delay at step 634 may be considered as a "long" delay, which is longer than the "short" delay applied at step 630. It will be appreciated that a different period for the suspension may be chosen, but the period of the suspension at step 634 is typically greater than the delay interval of step 630.

After step 634, the process proceeds to step 604 where a subsequent sample is taken, as described above.

Figure 7A:
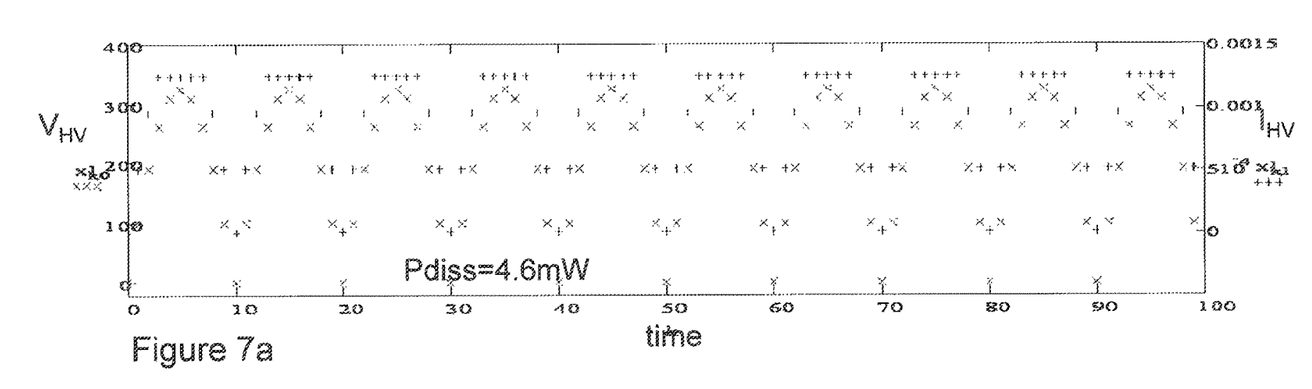
FIG. 7a illustrates 1 millisecond interval samples of a modulus of a sine wave input and corresponding currents.
Figure 7B:
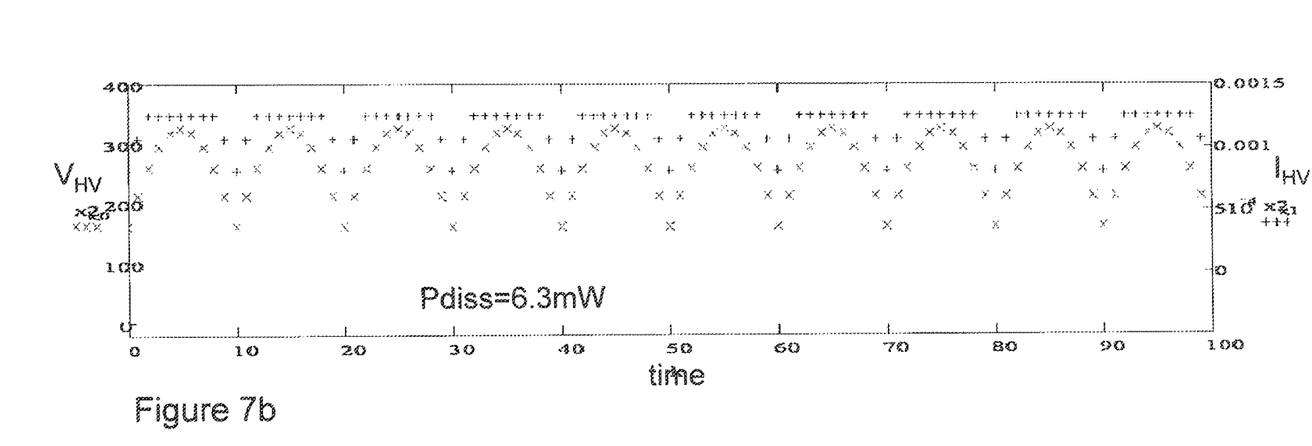
FIG. 7b illustrates 1 millisecond interval samples of an outset rectified sine wave input and corresponding currents.
Figure 8A:
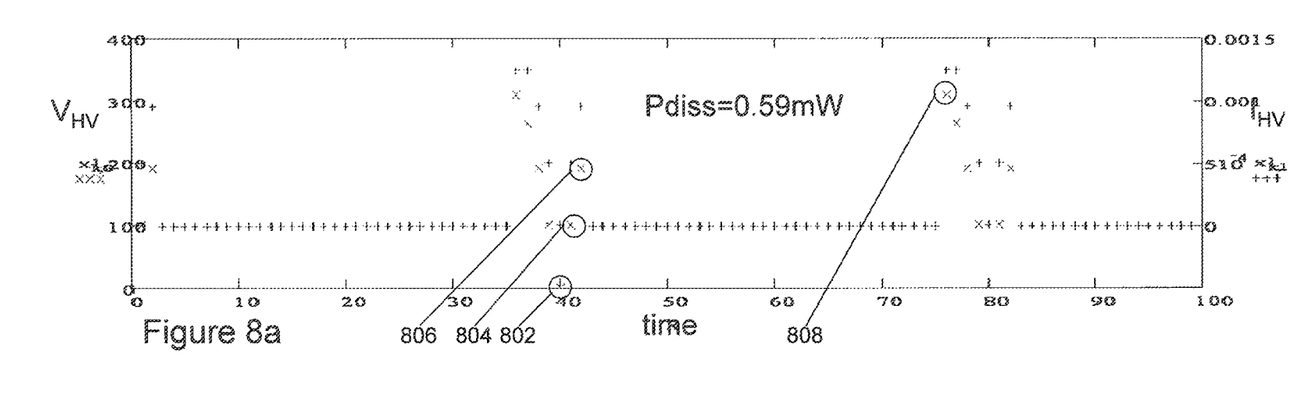
FIG. 8a illustrates 1 millisecond interval samples of a modulus of a sine wave input and corresponding currents sampled by a circuit that can suspend sampling.
Figure 8B:
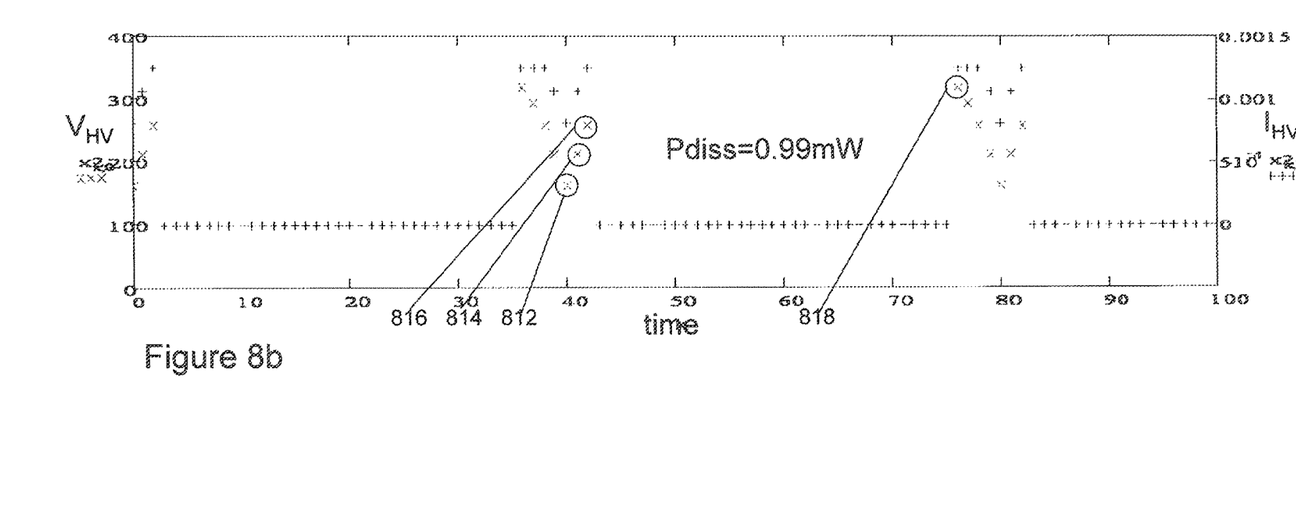
FIG. 8b illustrates 1 millisecond interval samples of an outset rectified sine wave input and corresponding currents sampled by a circuit that can suspend sampling.

FIG. 7 illustrates the input voltage and input current of a power supply unit as sampled by a conventional control circuit. FIG. 8 illustrates the input voltage and input current of a power supply unit as sampled by a control circuit that is configured to suspend sampling such as the circuit of FIG. 4a. The data are obtained where the input voltage of the power supply unit is the modulus of a full sine wave signal. The input voltage is a rectified sine wave signal. The root mean squared input voltage is 230 Vac.

In the examples of FIGS. 7 and 8, data are shown at 1 millisecond intervals along the horizontal time axis. The magnitude of the current is shown on the vertical axis on the right hand side of FIGS. 7 and 8. The duration of each sample is 20 microseconds. Data points marked by a "+" represent the current through the sampling and discharge path during each sample period. The magnitude of the voltage is shown on the vertical axis on the left hand side of FIGS. 7 and 8. Data points marked by an "x" represent the voltage between the diodes 222, 224 and resistor 228 of FIG. 2. In this example the clamp level current is 10% above the high detection level. Normally the current follows the voltage shape, but when the mainslow level is detected it does not make sense to increase the current. So in this example the current is limited to a current which corresponds with a voltage that is 10% higher than the mainslow level. An example implementation of a current clamp is described above in relation to FIG. 4c. The current clamp can be implemented to reduce power dissipation of the power supply unit. Without such a current clamp, the system still functions but may have reduced power efficiency.

FIGS. 7a and 7b illustrate the sample output of a conventional control circuit that takes a sample at 1 millisecond intervals. In this example, only "short" delay intervals are used. The shifted voltage of FIG. 7b does not drop to zero because of the effect of voltage rectification. This results in more dissipation in the X cap sensing circuit as shown in FIGS. 7b and 8b. The power dissipated by the control circuit when operating on the voltage waveform shown in FIG. 7a is 4.6 mW. The power dissipated by the control circuit when operating on the voltage waveform shown in FIG. 7b is 6.3 mW.

FIGS. 8a and 8b illustrate the sample output of a control circuit that can take a sample after a "short" delay period or a "long" delay period depending upon a metric of the supply voltage. A "short" delay of 1 millisecond is used unless a positive increase in the supply voltage is detected, in which case sampling is suspended for 32 ms, thereby applying the long delay. During the suspension, no voltage samples are taken and so no "x" data points are seen. The sampling and discharge path has no current passing through the suspension period and so the "+" data points are at 0 A during the suspension period. The power dissipated by a control circuit operating in this mode is 0.59 mW for the input waveform shown in FIGS. 8a and 0.99 mW for the input waveform shown in FIG. 8b. FIG. 8a shows a zeroth 802, a first 804, a second 806 and a third 808 sample.

The zeroth sample 802 is below the brownout level in this example and so the corresponding output of the two bit ADC of FIG. 4a is 00. The first sample 804 is also below the brownout level in this example and so the corresponding output of the two bit ADC is 00. A comparison (such as that described with reference to FIG. 6) between the ADC output for the zeroth sample 802 and the ADC output for the first sample 804 therefore shows no change, even though it can be seen from FIG. 8a that the first sample value is substantially higher than the zeroth sample value. A system that compares the values provided by such an ADC may therefore not detect an increase in voltage between the first and second samples.

The second sample 806 is above the brownout level and below the low level voltage level, so the corresponding output of the two bit ADC of FIG. 4a is 01. A comparison between the ADC output for the first sample 804 and the ADC output for the second sample 806 therefore shows an increase in the sampled voltage and so sampling can be suspended by a control circuit in order to reduce power consumption of a power supply unit. A third sample 808 is taken after an extended delay has elapsed. However, performing a simplified comparison of a course digitized sample can result in a simplified and cheaper implementation. It will be appreciated that the power loss from the requirement to occasionally providing an extra sample may be negligible in many circumstances.

FIG. 8b shows a zeroth 812, a first 814, a second 816 and a third 818 sample.

The zeroth sample 812 above the brownout level and below the low level voltage so the corresponding output of the two bit ADC of FIG. 4a is 01. The first sample 814 is also above the brownout level and below the low level voltage so the corresponding output of the two bit ADC is 01. A comparison between the ADC output for the zeroth sample 812 and the ADC output for the first sample 814 therefore shows no change.

The second sample 816 is above the low level voltage so the corresponding output of the two bit ADC of FIG. 4a is 11. A comparison between the ADC output for the first sample 804 and the ADC output for the second sample 806 therefore shows an increase in the sampled voltage and so sampling can be suspended by a control circuit in order to reduce power consumption of a power supply unit. A third sample 818 is taken after an extended delay has elapsed.

It is therefore apparent that by determining a sign of a difference between two of the plurality of samples of the metric and suspending the repeated sampling if the difference has a specific sign (which in this case is indicative of a voltage increase), the control circuit is able to reduce its power consumption. When the results of FIGS. 7a and 8a are considered, the power consumption is reduced from 4.6 mW to 0.59 mW, which represents a significant improvement. Furthermore, the reduction in power consumption is not substantially detrimental to the ability of the control circuit to discharge any charge stored across the inputs of the power supply unit when the power supply has been removed, as the control circuit response time can be maintained within a safe level. In this example, the response time to a power removal event has been increased by up to 31 ms. In comparison, the time required to discharge the capacitor is of the order of a few 100 ms. In some operating regimes, a 1 or 2 second period at which the input at the power supply is at a high level may be acceptable.

Some embodiments disclosed herein relate to a circuit or method that can detect if an increase in the power supply voltage has occurred. The detected increase in power supply voltage is indicative of the presence of an AC mains supply. The circuit is or method need not, therefore monitor the supply for a duration substantially longer than atypical duration between samples. Power consumption can be improved by reducing the sampling rate whilst maintaining the ability of the device to determine when the power supply is removed within statutory guidelines.

It will be appreciated that any reference to "close to", "before, "shortly before", "after" or "shortly after" etc. can refer to the parameter in question being less than or greater than a threshold value, or between two threshold values, depending upon the context.

It will be appreciated that any components that are described herein as being coupled or connected could be directly or indirectly coupled or connected. That is, one or more components could be located between two components that are said to be coupled or connected whilst still enabling the required functionality to be achieved.

The invention claimed is:

1. A system configured to regulate a power supply, wherein the power supply is configured to receive a mains supply across first and second inputs, the system comprising:
a first diode having an anode coupled to the first input;
a second diode having an anode coupled to the second input; and
a control circuit configured to sample either the first input or the second input, based upon whether the first diode or the second diode is conducting, in order to obtain a first sample value and a second sample value subsequent to the first sample value, and compare the first sample value and the second sample value to determine whether a voltage of the power supply has increased between the first sample value and the second sample value, set a delay interval in accordance with the determined voltage, wherein a longer delay interval is applied when the determined voltage has increased between the first sample value and the second sample value, and obtain a third sample value after the delay interval has elapsed, wherein sampling is suspended when it is determined that the mains supply is present.

2. The system of claim 1, wherein the control circuit is further configured to set the delay interval as a first delay interval if the determined voltage is indicative of the second sample value being smaller than or equal to the first sample value and set the delay interval as a second delay interval if the determined voltage is indicative of the second sample value being larger than the first sample value.

3. The system of claim 2, wherein the second delay interval is longer than the first delay interval.

4. The system of claim 3, wherein the second delay interval has a duration of more than 10, 32, 64 milliseconds or 0.5 or 1 second, or is greater than or equal to a duration of a quarter or a half of an AC waveform of the mains supply.

5. The system of claim 1, further comprising:
a drainage switch configured to selectively connect the first and second inputs via a resistor to ground in accordance with a control signal, wherein the control circuit is further configured to, when the determined voltage is indicative of the second sample value being smaller than or equal to the first sample value, increment a count of how many consecutive sample values are smaller than or equal to an immediately preceding sample value, when the count is greater than a threshold, set the control signal for closing the drainage switch, and when the count is not greater than the threshold, set the control signal for opening the drainage switch.

6. The system of claim 5, wherein a duration of the threshold is such that the consecutive sample values are obtained over at least one and a half AC waveforms of the mains supply.

7. The system of claim 5, further comprising:
a current limiting circuit configured to limit a maximum current that can pass through the drainage switch to a limited current level.

8. The system of claim 1, further comprising:
a capacitor coupled between the first input and the second input;
a drainage switch configured to selectively discharge the capacitor or allow sampling of the first or second inputs in response to receiving a control signal, wherein the control circuit is further configured to provide the control signal to the drainage switch in order to sample the first or second inputs in accordance with the determined voltage.

9. The system of claim 8, wherein the drainage switch is configured to couple the first and second inputs via a resistor to ground in response to receiving the control signal.

10. The system of claim 1, wherein each sample value comprises a metric of the mains supply that is, or is related to, a voltage between the first and second inputs and ground.

11. The system of claim 1, wherein the power supply is a battery charger.

12. The system of claim 1, wherein a filter capacitor at an input of the power supply is discharged when it is determined that the mains supply is not present.

13. A method for controlling sampling of a power supply configured to receive a mains supply across first and second inputs, comprising:
sampling, with a control circuit, either the first input or the second input, based upon whether a first diode or a second diode is conducting, in order to obtain a first sample value and a second sample value subsequent to the first sample value;
comparing, in the control circuit, the first sample value and the second sample value to determine whether a voltage of the power supply has increased between the first sample value and the second sample value;
setting, in the control circuit, a delay interval depending on the determined voltage, wherein a longer delay interval is applied when the determined voltage has increased between the first sample value and the second sample value; and
sampling, in the control circuit, the input in order to obtain a third sample value after the delay interval has elapsed, wherein sampling is suspended when it is determined that the mains supply is present.

14. The method of claim 13, further comprising:
setting the delay interval as a first delay interval if the determined voltage is indicative of the second sample value being smaller than the first sample value; and
setting the delay interval as a second delay interval if the determined voltage is indicative of the second sample value being larger than the first sample value.

15. The method of claim 14, wherein the second delay interval is longer than the first delay interval.

16. The method of claim 14, further comprising:
considering the second sample value as the first sample value in an immediately subsequent iteration if the delay interval is set as the first delay interval; or
considering the third sample value as the first sample value in an immediately subsequent iteration if the delay interval is set as the second delay interval.

17. The method of claim 13, further comprising:
discharging a filter capacitor at an input of the power supply when it is determined that the mains supply is not present.

* * * * *